United States Patent
Liu et al.

(10) Patent No.: US 7,641,938 B2
(45) Date of Patent: Jan. 5, 2010

(54) METHOD FOR MANUFACTURING CARBON NANOTUBE COMPOSITE MATERIAL

(75) Inventors: Chang-Hong Liu, Beijing (CN); Yuan Yao, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/986,365

(22) Filed: Nov. 21, 2007

(65) Prior Publication Data
US 2008/0087646 A1    Apr. 17, 2008

Related U.S. Application Data

(62) Division of application No. 11/309,822, filed on Oct. 3, 2006, now abandoned.

(30) Foreign Application Priority Data
Apr. 14, 2006    (CN)    .................. 2006 1 0060309

(51) Int. Cl.
*C23C 16/00*    (2006.01)

(52) U.S. Cl. ................................................. 427/249.1
(58) Field of Classification Search .............. 427/249.1, 427/307, 309
See application file for complete search history.

(56) References Cited

U.S. PATENT DOCUMENTS

| 7,160,620 | B2 |   | 1/2007 | Huang et al. |         |
|-----------|----|---|--------|--------------|---------|
| 7,253,442 | B2 |   | 8/2007 | Huang et al. |         |
| 7,291,396 | B2 | * | 11/2007| Huang et al. | 428/408 |
| 7,393,428 | B2 | * | 7/2008 | Huang et al. | 156/249 |
| 7,396,477 | B2 | * | 7/2008 | Hsiao        | 216/2   |

* cited by examiner

*Primary Examiner*—Roberts Culbert
(74) *Attorney, Agent, or Firm*—D. Austin Bonderer (57) ABSTRACT

A method for manufacturing the carbon nanotube composite material includes the steps of: providing a substrate, the substrate having a surface; forming a catalyst film in a special predetermined pattern on the surface of the substrate; forming a carbon nanotube array on the catalyst film to obtain the carbon nanotube array having a special predetermined pattern; providing a pair of protective layers, the protective layers being attached on a corresponding portion of ends of CNT array; filling clearances existing among CNTs of the CNT array and between the two protective layers with a matrix material; and removing the protective layers from CNT array.

20 Claims, 9 Drawing Sheets

METHOD FOR MANUFACTURING CARBON NANOTUBE COMPOSITE MATERIAL

CROSS-REFERENCE TO RELATED APPLICATIONS

This application is a divisional application of U.S. Patent Application, entitled "CARBON NANOTUBE COMPOSITE MATERIAL AND METHOD FOR MANUFACTURING THE SAME" with application Ser. No. 11/309,822, filed on Oct. 3, 2006 and having the same assignee as the instant application. The content of the above-referenced application is hereby incorporated by reference.

BACKGROUND

1. Field of the Invention

The present invention relates to methods for manufacturing composite materials and, particularly, to a method for manufacturing a carbon nanotube composite material.

2. Discussion of Related Art

Carbon nanotubes (CNTs) are tube-shaped structures composed of graphite. CNTs have a high Young's modulus, a high thermal conductivity, and a high electrical conductivity, and other properties. Due to these and the other properties, it has been suggested that CNTs can play an important role in fields such as microelectronics, material science, biology, and chemistry.

A kind of thermally conductive material that conducts heat by using CNTs has been developed. The thermally conductive material is formed by injection molding and has numerous CNTs dispersed in a matrix material. The thermally conductive material includes a first surface engaging with an electronic device, and a second surface engaging with a heat sink. The second surface has a larger area than the first one, so that heat can be uniformly spread out to the larger second surface. However, the thermally conductive material formed by injection molding is relatively thick, which increases a bulk of the thermally conductive material and reduces its flexibility. Furthermore, CNTs are dispersed in the matrix material randomly and are multidirectional in orientation, which results that heat tends to spread uniformly through the thermally conductive material, retaining much of the heat within the heat transfer material. Therefore, the heat does not spread efficiently from the first surface engaged with the electronic device to the second surface engaged with the heat sink.

Therefore, a method for manufacturing a thin carbon nanotube composite material, with controlled nanotube orientation within one or more desired patterns and, thus, with good thermal/electrical conductivity, is desired.

SUMMARY OF THE INVENTION

A method for manufacturing the carbon nanotube composite material includes the steps of: providing a substrate, the surbstrate having a surface; forming a catalyst film in a desired pattern on the surface of the substrate; forming a carton nanotube array on the catalyst film to obtain the carbon nanotube array having desired pattern, each carbon nanotube (CNT) in the carbon nanotube array having top and bottom end portions; forming a protective layer on the top end portion of the CNT array; filling clearances among the CNTs of the CNT array; and removing the protective layer and the substrate from the carbon nanotube array so as to exposing the top end portion and the bottom end portion of the bottom nanotube array.

Other advantages and novel features will become more apparent from the following detailed description when taken in conjunction with the accompanying drawings.

BRIEF DESCRIPTION OF THE DRAWINGS

Many aspects of the carbon nanotube composite material can be better understood with reference to the following drawings. The components in the drawings are not necessarily to scale, the emphasis instead being placed upon clearly illustrating the principles of the present carbon nanotube composite material. Moreover, in the drawings, like reference numerals designate corresponding parts throughout the several views.

The exemplifications set out herein illustrate a method for manufacturing carbon nanotube composite materials, and such exemplifications are not to be construed as limiting the scope of the invention in any manner.

DETAILED DESCRIPTION OF THE INVENTION

Figure 1:
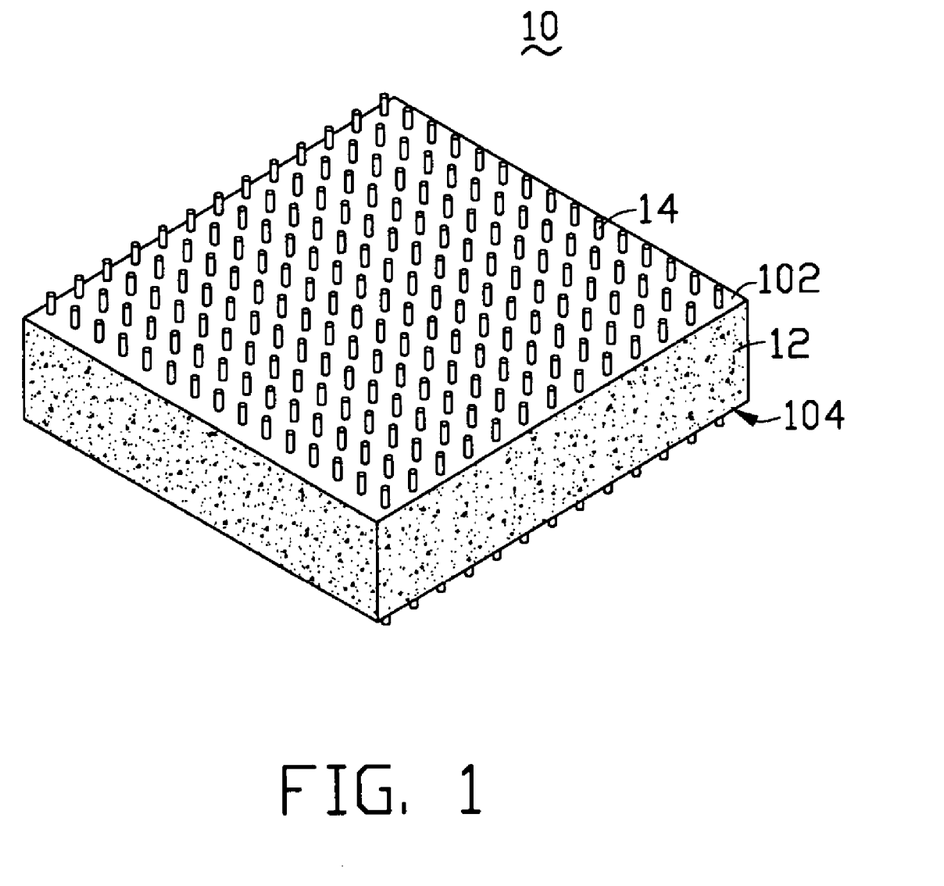
FIG. 1 is a schematic, isometric view of a carbon nanotube composite material according to a preferred embodiment.
Figure 2:
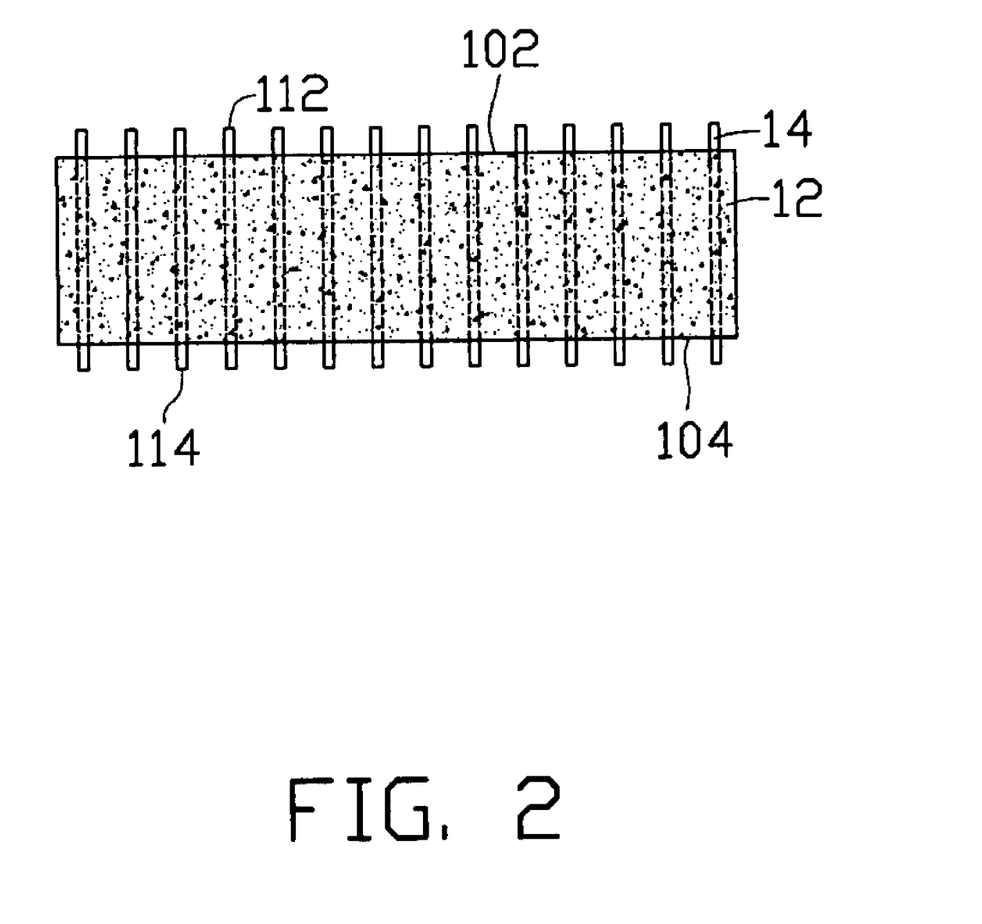
FIG. 2 is a schematic, side view of the carbon nanotube composite material of FIG. 1.

Referring to FIG. 1 and FIG. 2, a carbon nanotube composite material 10, according to an exemplary embodiment, includes a matrix material 12 and a carbon nanotube array 14 having a number of CNTs. The matrix material 12 has a first surface 102 and a second surface 104 opposite to the first surface 102. The carbon nanotube array 14 is embedded in the matrix material 12, and the CNTs of the carbon nanotube array 14 are uniformly dispersed in a desired pattern. Each CNT of the carbon nanotube array 14 has a first end portion 112 and a second end portion 114 opposite to the first end portion 112. The two opposite end portions 112 and 114 advantageously extend out of at least the two opposite surfaces 102, 104, respectively, and, in order to facilitate a connection with other components, are, further advantageously, exposed. If not exposed, however, the first and second portions 112 and 114 can be beneficially protected by the surrounding matrix material 12 but do have the drawback of not being able to be as intimately connected to adjoining components as may be possible if exposed. The matrix material 12 is, advantageously, selected from the group consisting of silica gel, polyethylene glycol, polyester, epoxy resin, and acrylic.

The two opposite surfaces 102 and 104 are substantially parallel to each other. The carbon nanotube array 14 is beneficially in a form of an aligned carbon nanotube array. Each CNT of the carbon nanotube array 14 is substantially parallel to one another and further substantially perpendicular to the two opposite surfaces 102 and 104. Thus, each CNT of the carbon nanotube array 14 can provide a direct, shortest-distance thermal conduction path and/or electrical transmission path from one surface to another of the matrix material 12.

Figure 3:
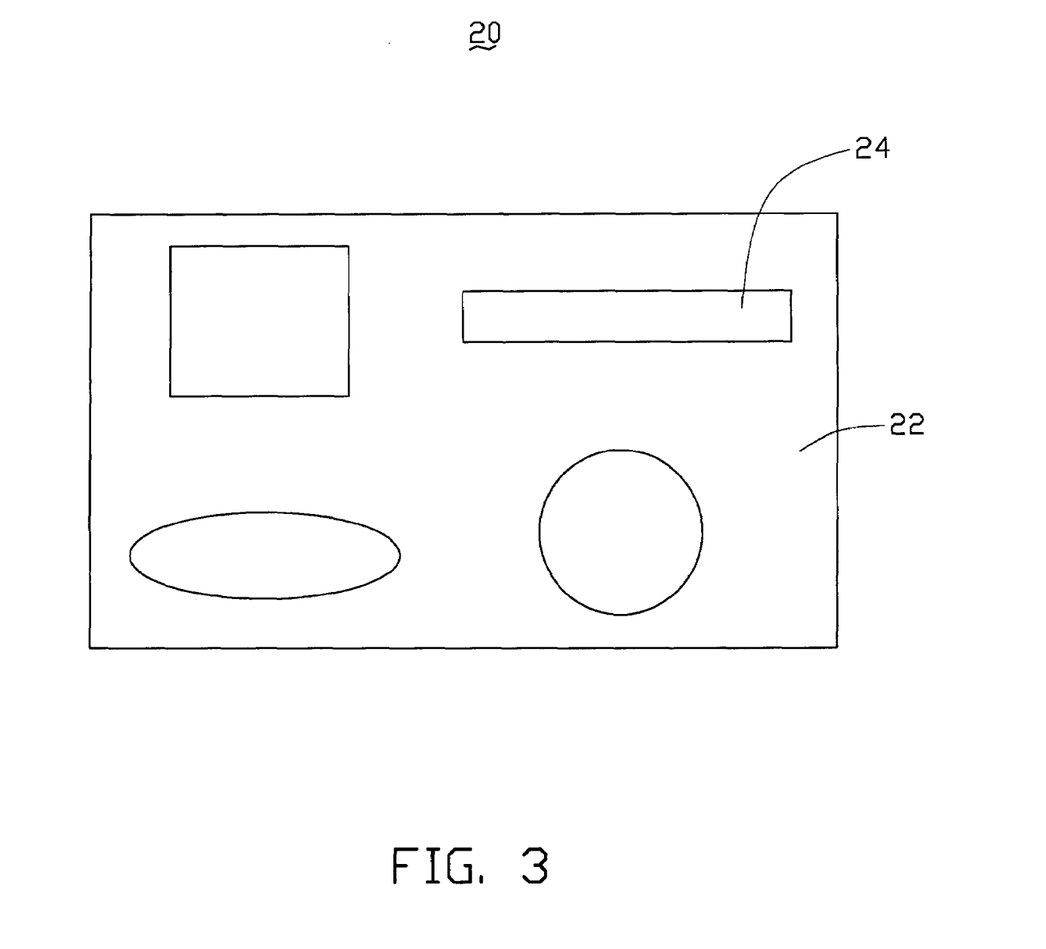
FIG. 3 is a top view of the carbon nanotube composite material, in which several carbon nanotube array patterns are provided, according to a preferred embodiment.

Referring to FIG. 3, a patterned carbon nanotube composite material 20 includes a matrix material 22 having two opposite surfaces and a number of patterned carbon nanotube arrays 24 embedded therein. Each CNT of the carbon nanotube arrays 24 includes two opposite end portion that respectively extend from two opposite surfaces of the matrix material 22. The carbon nanotube arrays 24 can be patterned in a desired position, e.g., of an Integrated Circuit (IC) chip and/or can be formed into a geometrical figure, such as a circle, rectangle, ellipse, square, or any combination thereof. The carbon nanotube array 24 is sandwiched between the IC chip and a printed circuit board (PCB) for improving electrical connection therebetween and/or thermal conduction from the IC chip to ambient and/or a heat sink.

Figure 4:
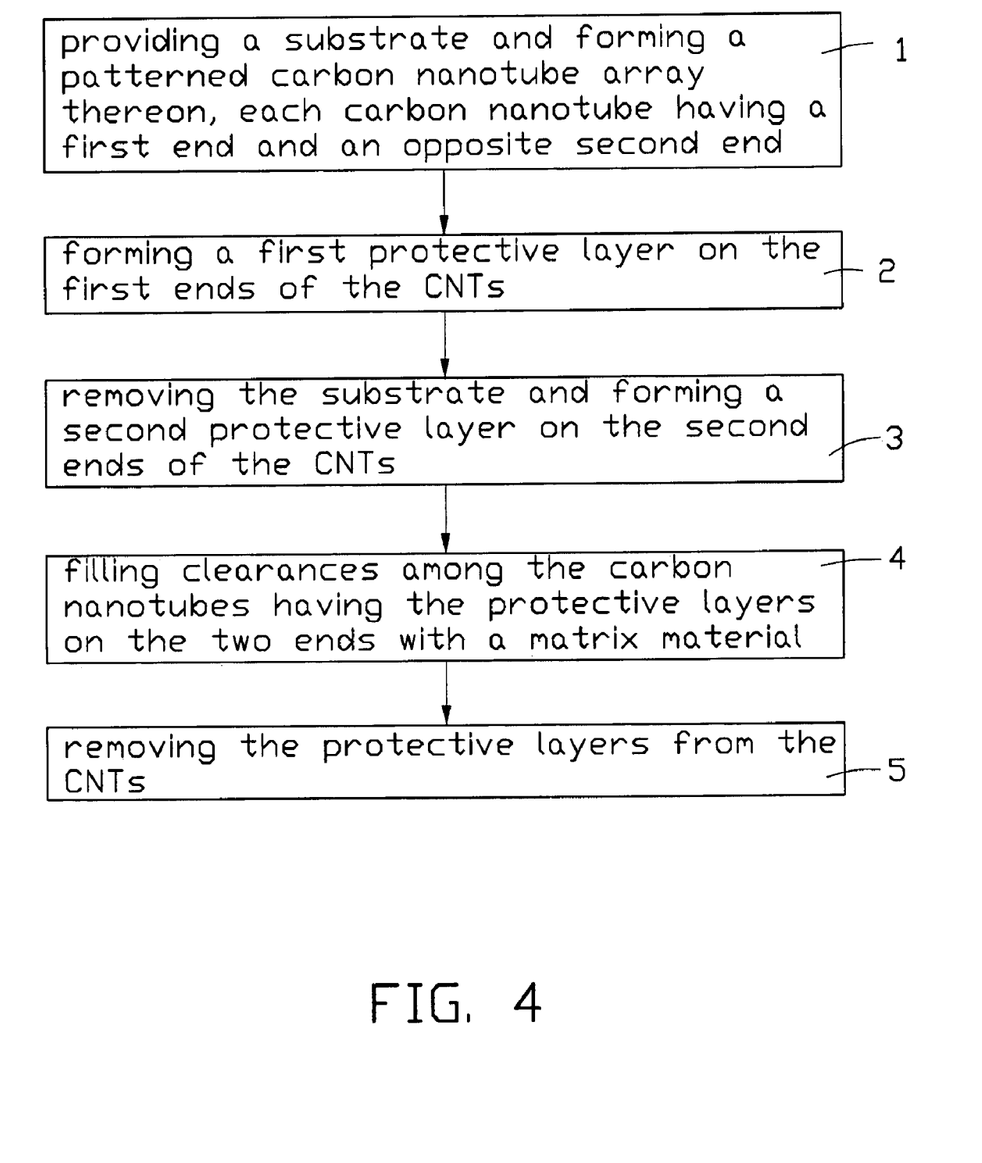
FIG. 4 is a flow chart of a method for manufacturing the carbon nanotube composite material of FIG. 1.

As shown in FIG. 4, a method for manufacturing the carbon nanotube composite material 10 is provided. The method employs an in-situ injection molding process, which comprises the steps of:

Step 1, providing a substrate, the substrate having a surface;

Step 2, forming a catalyst film in a desired pattern on the surface of the substrate;

Step 3, forming a carbon nanotube array on the catalyst film to obtain the carbon nanotube array having a desired pattern;

Step 4, forming a first protective layer on the first end portions of the CNTs;

Step 5, removing the substrate and forming a second protective layer on the second end portion of the CNTs;

Step 6, filling clearances among the CNTs between the first protective layer and the second protective layer with a matrix material; and Step 7, removing the first and second protective layers from the CNT array so as to exposing the top end portion and the bottom end portion of the carbon nanotube array.

Referring to FIGS. 5 through 8, the method for manufacturing the carbon nanotube composite material 10, in accordance with the preferred embodiment, is described below, in detail.

Figure 5:
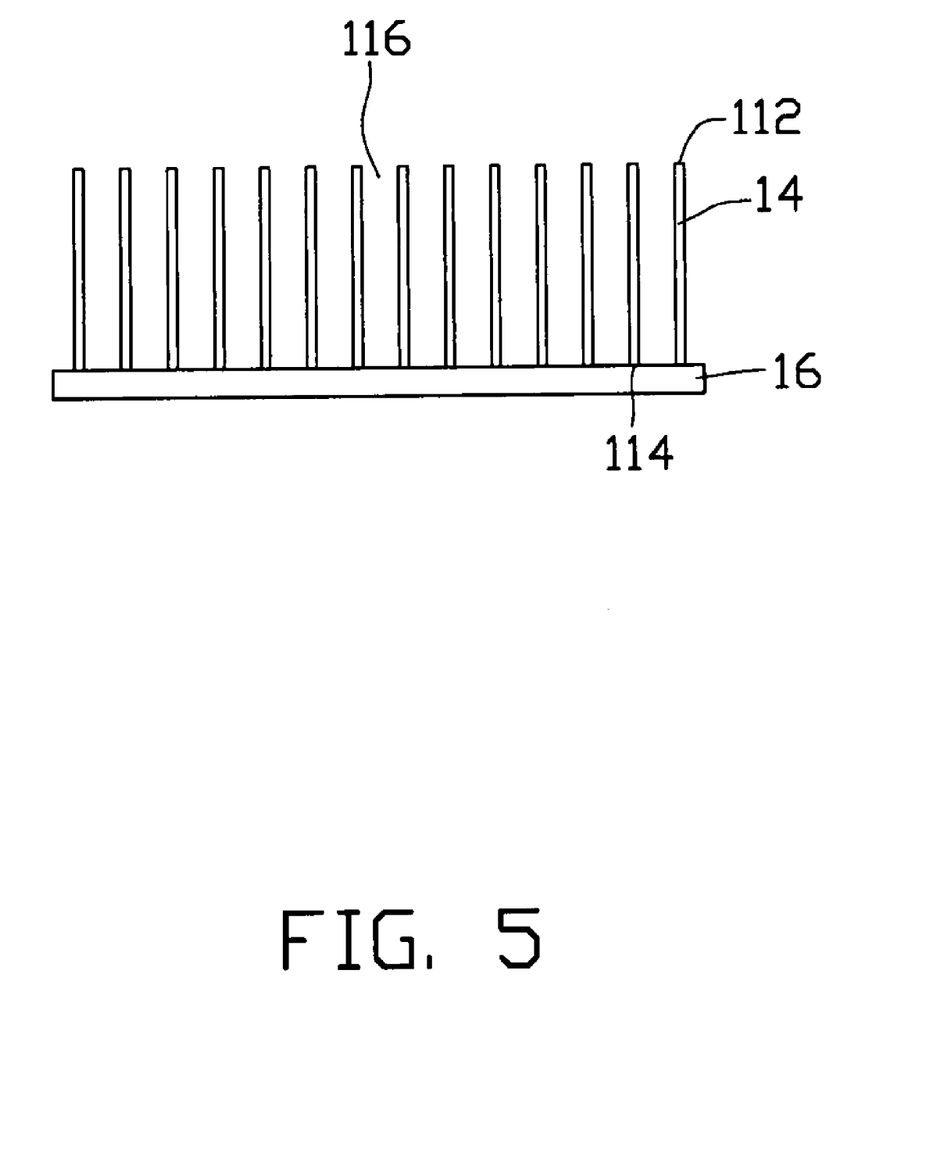
FIG. 5 to FIG. 8 are schematic views illustrating the manufacturing steps 1-5 in FIG. 4.

In step 1, as shown in FIG. 5, a substrate 16 is provided and a patterned carbon nanotube array 14 is formed thereon. A number of clearances 116 are defined among the adjacent CNTs. The carbon nanotube array 14 can be formed, for example, by a chemical vapor deposition method.

The chemical vapor deposition method for manufacturing the carbon nanotube array 14 generally includes steps of: firstly, forming a catalyst film (not labeled) on the substrate 16 and then growing carbon nanotube array 14 thereon by providing a carbon source gas at high temperature. The substrate 16 is beneficially made from a material selected from the group consisting of glass, silicon, metal, and metal oxide. The catalyst film can, usefully, be made from material selected from the group consisting of iron (Fe), cobalt (Co), nickel (Ni), and an alloy thereof. The carbon source gas can be, e.g., methane, ethylene, propylene, acetylene, methanol, ethanol, or some mixtures thereof. In the preferred embodiment, a silicon wafer is used as the substrate 16, iron as the catalyst film, and ethylene as the carbon source gas. An iron film pattern having a thickness of about 5 nanometers (nm) is formed on the substrate 16 and is annealed in air at 300° C. Then, the substrate 16 with the iron film deposited thereon is placed into a chemical vapor deposition chamber (not labeled), an ethylene gas is provided therein at 700° C., and then the carbon nanotube array 14 is produced. The carbon nanotube array 14 grown is about 0.3 millimeters (mm) high and substantially perpendicularly to the substrate 16.

Figure 6:
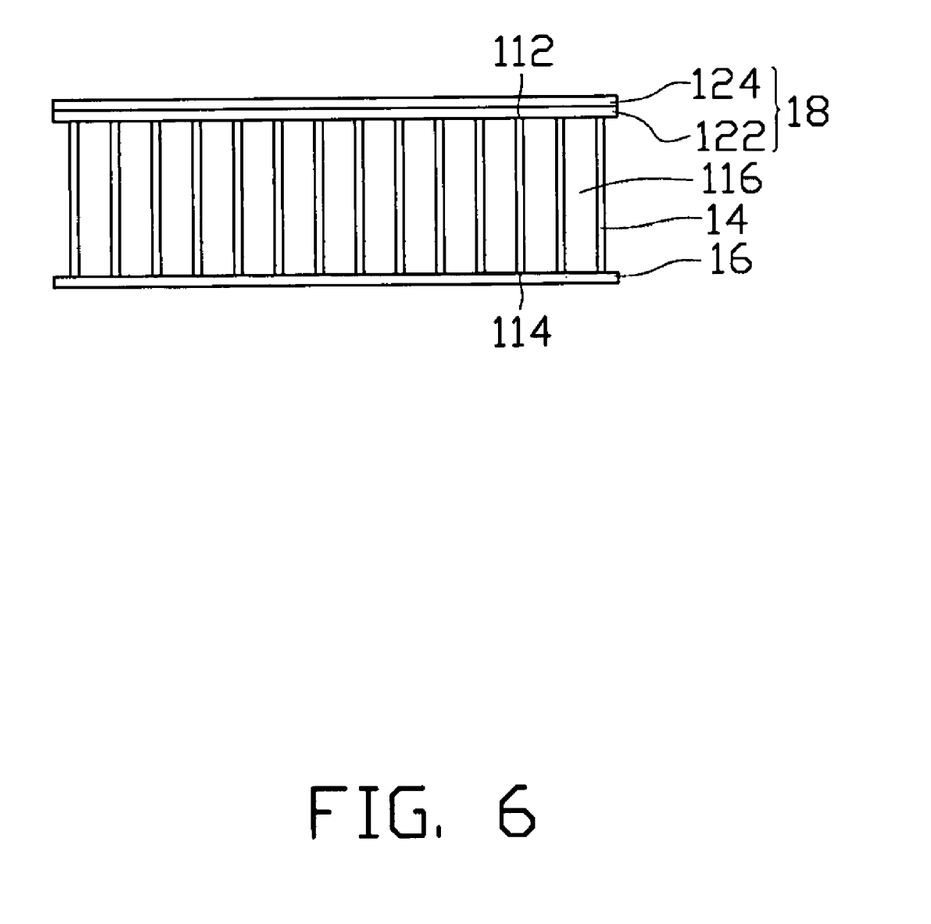

In step 4, as shown in FIG. 6, a first protective layer 18 is formed on the first end portions 112 of the carbon nanotube array 14. The first protective layer 18 includes a polyester film 124 and a pressure sensitive adhesive layer 122 disposed thereon. In the preferred embodiment, the pressure sensitive adhesive layer 122 has a thickness about 0.05 mm and is coated on a side of the polyester film 124. More specifically, the first protective layer 18 can be attached to the carbon nanotube array 14 as follows: placing the first protective layer 18 on the carbon nanotube array 14 with the pressure sensitive adhesive 122 facing towards the first end portions 112; pressing the first end portions 112 of the carbon nanotube array 14 into the pressure sensitive adhesive layer 122, thereby directly attaching the first protecting layer 18 to the carbon nanotube array 14. The pressure sensitive adhesive layer 122 is a soft and adhesive material, which allows the first end portions 112 to be inserted thereinto when an external force is applied thereon. The pressure sensitive adhesive layer 122 used in this exemplary embodiment is YM881 (produced by Light Industry Institute, Fushun, China). The pressure sensitive adhesive layer 122 can, alternatively, be made of other adhesive materials with high viscosity, such as glue. Moreover, the polyester film 124 may be made of other polymers, such as polyethylene.

In another embodiment, the first protective layer 18 may only include the polyester film 124. The polyester film 124 can be directly attached to the carbon nanotube array 14 as follows: placing the polyester film 124 on the carbon nanotube array 14; and pressing the first end portions 112 of the carbon nanotube array 14 into the polyester film 124, thereby attaching the polyester film 124 to the carbon nanotube array 14.

Figure 7:
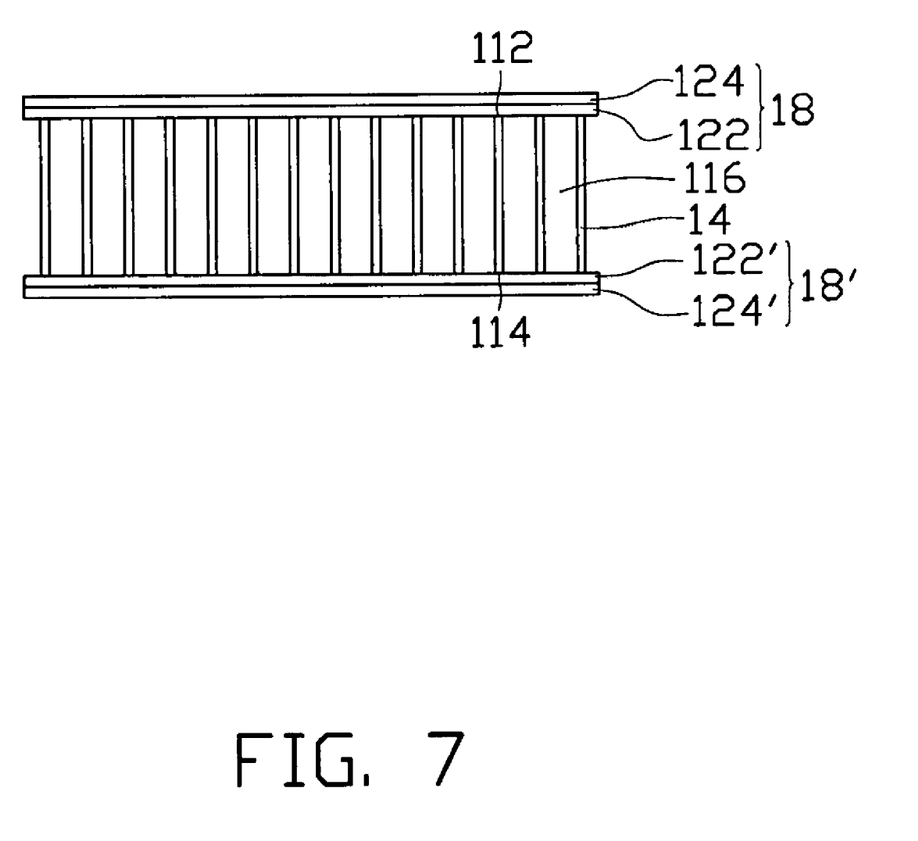

In step 5, as shown in FIG. 7, the substrate 16 is removed from the second end portions 114, and the second protective layer 18' is attached to the second end portions 114. The second protective layer 18' includes a pressure sensitive adhesive layer 122' and a polyester film 124'. The step of attaching the second protective layer 18' to the second end portions 114 is similar to that of the first protective layer 18 in the step 3. Thereby, the carbon nanotube array 14 along with the two protective layers 18 and 18' attached on the two opposite end portions 112 and 114 thereof constitute an injection mold.

It is noted that step 5 is an optional step. The carbon nanotube array 14 can be formed by an injection mold along with the first protective layer 18 attached to the first end portions 112 and the substrate 16 attached to the second end portions 114. As a further alternative, the substrate 16 could be permitted to remain instead of being replaced with the second protective layer 18' and to thereby act as part of the injection mold.

Figure 8:
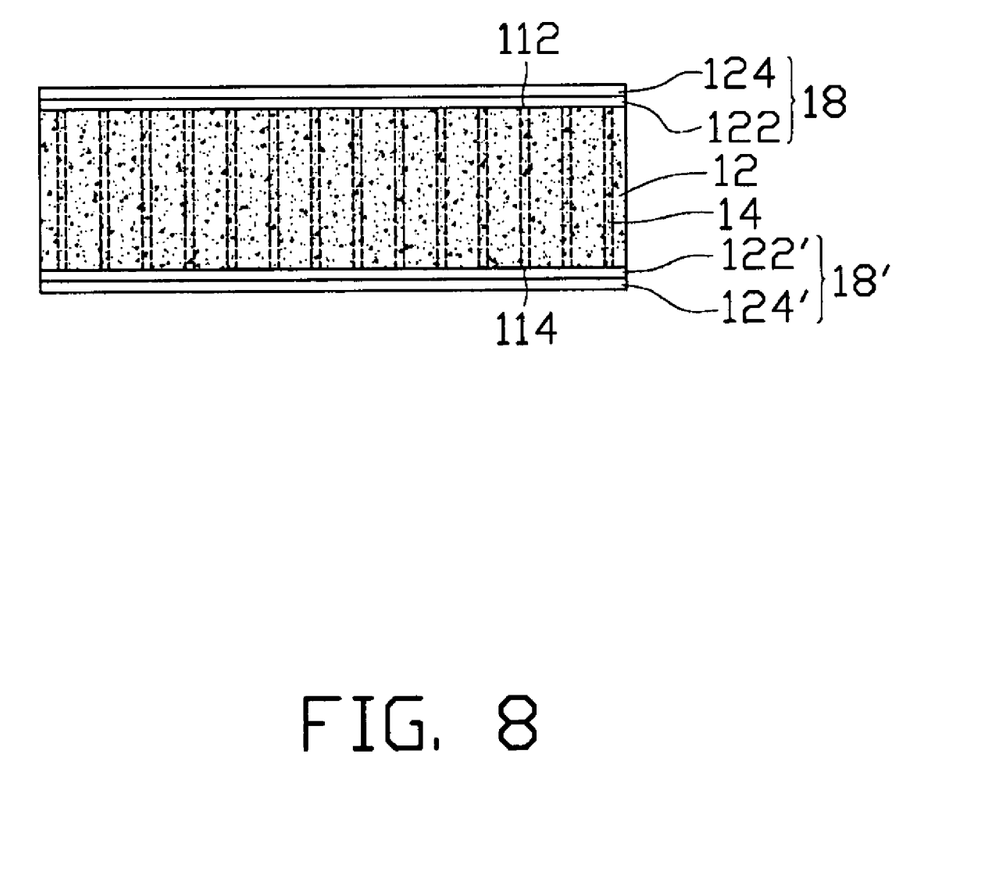

In step 6, as shown in FIG. 8, the clearances 116 among the carbon nanotube array 14 are filled with the matrix material 12. This step can be performed in the following manner: immersing the carbon nanotube array 14 with two attached protective layers 18 and 18' into a melt or solution of the matrix material 12; taking the carbon nanotube array 14, now having the matrix material 12 filled among the clearances 116, out of the melted or solution of the matrix material 12; and curing the matrix material 12 among the clearances 116 in vacuum at room temperature for 24 hours, thereby causing the matrix material 12 to become soft and elastic. The matrix material 12 is advantageously selected from the group consisting of silica gel, polyethylene glycol, polyester, epoxy resin, and acrylic. In the preferred embodiment, the matrix material 12 is made from the Sylgard 160, a type of a 2-part silicone elastomer, which is available from Dow Corning. The Sylgard 160 is supplied, as two separate liquid components comprised of part A and part B to be mixed in a 1:1 ratio by weight or volume. A mass percent of the CNTs in the carbon nanotube composite material is about 5 wt %.

In step 7, as shown in FIG. 2, both protective layers 18 and 18' are removed from the carbon nanotube array 14. The protective layers 18 and 18' can be removed, for example, by directly stripping off or sequentially be dissolved away any of the remaining pressure sensitive adhesive layers 122 and 122', by an organic solution. In the preferred embodiment, the organic solvent is xylene. Thus, the carbon nanotube composite material 10 is finished, which has first and second end portions 112, 114 of the carbon nanotube array 14 exposing the first and second surfaces 102 and 104 of the matrix material 12.

Preferably, the method for manufacturing the carbon nanotube composite material 10 can further include a reactive ion etching (RIE) step or another selective material removal step to ensure the both end portions 112 and 114 (i.e., both end portions of the respective CNTs) of the carbon nanotube array 14 be sufficiently exposed. In the preferred embodiment, the RIE process is carried out using O2 plasma at a pressure of 6 pascals (Pa) and with a power of 150 watts (W) for 15 minutes (min) at each of the surfaces 102 and 104 of the matrix material 12. Finally, a carbon nanotube composite material 10 having the both end portions 112 and 114 fully protruding out thereof is obtained.

The resulted carbon nanotube composite 10 can be further trimmed into any desired geometrical figure for used as, e.g., electrical and/or thermal conductive component. In addition, since the CNTs of the carbon nanotube composite 10 are bounded tightly within the matrix material 12, a stability and reliability of the carbon nanotube composite 10 is improved.

Figure 9:
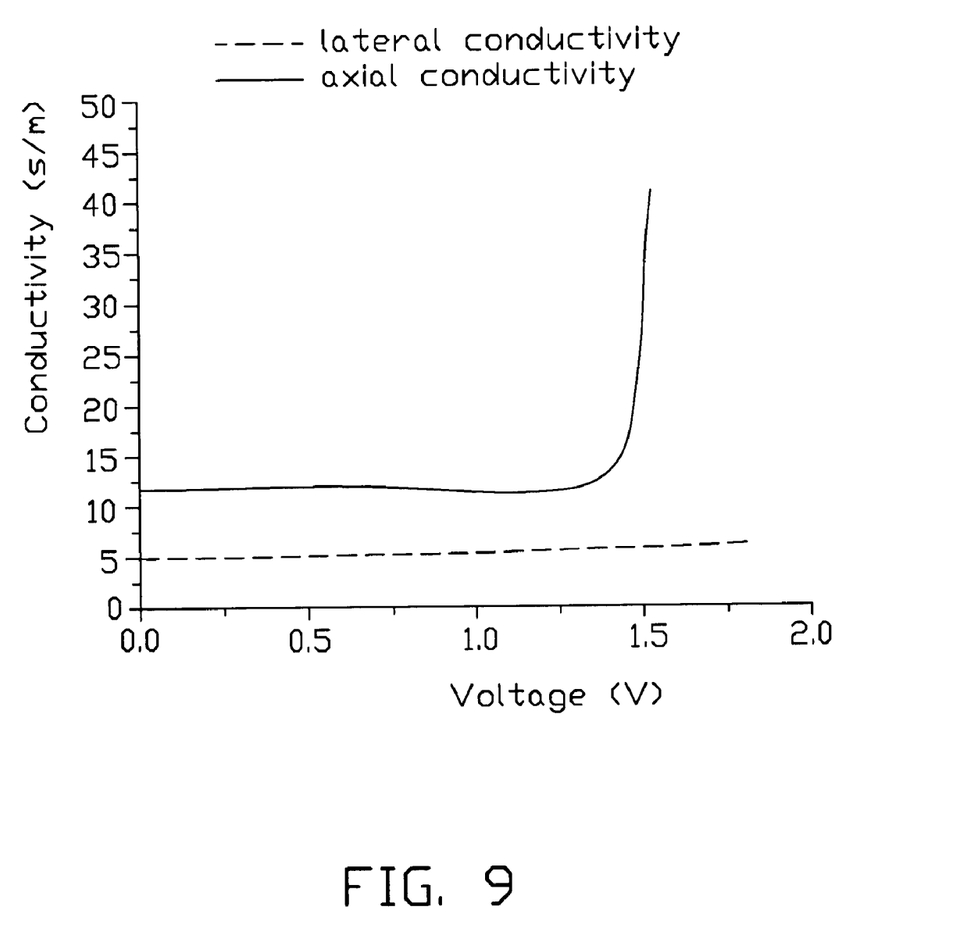
FIG. 9 is a diagram showing an electrical property of the carbon nanotube composite material according to a preferred embodiment.

Referring to FIG. 9, electrical conductivities of the carbon nanotube composite material 10 are measured. The solid line represents axial conductivity along a direction parallel to longitudinal axes of the CNTs, and the dashed line represents lateral conductivity along a direction perpendicular to the longitudinal axes of the carbon nanotubes. As be expected to given the alignment of the CNTs, the axial conductivity, over the entire voltage range, is markedly higher than the lateral conductivity. As a result, when the carbon nanotube composite material 10 is aligned, the maximum performance of thermal and/or electrical conduction and relative thereto along the axial direction can be expected.

The first and second end portions 112, 114 of the CNTs of the carbon nanotube array 14 are protruded out of first and second surfaces 102, 104. Thus, the first and second end portions 112, 114 of CNTs form two thermal contact surfaces or electrical connection surfaces directly in the axial direction, and the overall electrical conductivity/thermal conductivity of the carbon nanotube composite material 10 is improved. The carbon nanotube composite material 10 can be formed in a desired pattern, according to the application requirement, and can, e.g., be in a film form that makes them portable and integral. Moreover, the thickness and other dimensions of the carbon nanotube composite material 10 can be chosen by the designer based on the use requirements and, thus, are not limited to thin film applications. For these reasons, the carbon nanotube composite material 10 can, e.g., be applied in a large-scaled IC and furthermore in any large-scaled electronic component. Additional uses for the carbon nanotube composite material 10 beyond the electronics area (e.g., thermal transfer devices) are readily conceivable and are considered to be within the scope of the present composite material.

Finally, it is to be understood that the embodiments mentioned above are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A method for manufacturing a carbon nanotube composite material, comprising the steps of:
    providing a substrate, the substrate having a surface;
    forming a catalyst film on the surface of the substrate, the catalyst film including a first portion having a first shape and a second portion having a second shape different from the first shape, the first portion being spaced from the second portion;
    forming a first carbon nanotube array on the first portion of the catalyst film to obtain the first carbon nanotube array having the first shape and a second carbon nanotube array on the second portion of the catalyst film to obtain the second carbon nanotube array having the second shape, the first and second carbon nanotube arrays defining a top end portion and a bottom end portion, the bottom end portion being attached to the substrate, the first and second carbon nanotube arrays having a plurality of clearances among neighboring carbon nanotubes of the first and second carbon nanotube arrays;
    attaching a protective layer on the top end portion of the first and second carbon nanotube arrays;
    filling clearances among the carbon nanotubes with a matrix material; and
    removing the first protective layer and the substrate from the first and second carbon nanotube arrays so as to expose the top end portion and the bottom end portion of the first and second carbon nanotube arrays.

2. The method as claimed in claim 1, further comprising the step of etching the matrix material adjacent the top end portion and the bottom end portion of the first and second carbon nanotube arrays for further exposing the two end portions thereof.

3. The method as claimed in claim 1, wherein the first protective layer comprises a polyester film.

4. The method as claimed in claim 3, wherein the first protective layer further comprises a pressure sensitive adhesive layer.

5. The method as claimed in claim 1, wherein the step of attaching the first protective layer comprises the steps of placing the first protective layer on the top end portion of the first and second carbon nanotube arrays; and pressing the first protective layer into the top end portion of the first and second carbon nanotube arrays.

6. The method as claimed in claim 1, wherein the clearances are further defined between the substrate and the first protective layer.

7. The method as claimed in claim 1, wherein the matrix material is selected from the group consisting of silica gel, polyethylene glycol, polyester, epoxy resin, and an acrylic.

8. The method as claimed in claim 1, wherein before filling with the matrix material, further comprising the steps of:
    removing the substrate from the bottom end portion of the first and second carbon nanotube arrays; and
    forming a second protective layer on the bottom end portion of the first and second carbon nanotube arrays.

9. The method as claimed in claim 8, wherein the second protective layer comprises a polyester film.

10. The method as claimed in claim 8, wherein the second protective layer further comprises a pressure sensitive adhesive layer.

11. The method as claimed in claim 1, wherein the filling of clearances is achieved by an injection molding process.

12. The method as claimed in claim 1, further includes etching the first and second surface of the matrix material via reactive ion etching.

13. The method as claimed in claim 12, wherein the reactive ion etching is carried out using $O_2$ plasma.

14. The method as claimed in claim 13, wherein the reactive ion etching is carried out at pressure of about 6 pascals.

15. The method as claimed in claim 13, wherein the reactive ion etching is carried our wits power of about 150 watts.

16. The method as claimed in 1, wherein a method for filling clearances among the carbon nanotubes with a matrix material includes:
   immersing the first and carbon nanotube arrays with attached protective layer into a melt or solution of the matrix material;
   taking out the first and second carbon nanotube arrays;
   curing the matrix material amount the clearance in vacuum to cause the matrix material to become soft and elastic.

17. The method as claimed in claim 16, wherein a mass percent of the carbon nanotubes in the carbon nanotube composite material is about 5%.

18. The method as claimed in claim 1, wherein the first shape is rectangle and the second shape is a curve.

19. The method as claimed in claim 18, wherein the second shape is a circle.

20. The method as claimed in claim 1, wherein the first and second carbon nanotube arrays are connected together by the matrix material.

* * * * *